United States Patent
Knoll et al.

(10) Patent No.: US 10,289,770 B2
(45) Date of Patent: May 14, 2019

(54) ROTORCRAFT COMPONENT SIMULATION USING SCAN-BASED GEOMETRY

(71) Applicant: Bell Helicopter Textron Inc., Fort Worth, TX (US)

(72) Inventors: Jonathan A. Knoll, Fort Worth, TX (US); Jeffrey P. Nissen, Fort Worth, TX (US); John R. McCullough, Fort Worth, TX (US)

(73) Assignee: Bell Helicopter Textron Inc., Fort Worth, TX (US)

( * ) Notice: Subject to any disclaimer, the term of this patent is extended or adjusted under 35 U.S.C. 154(b) by 423 days.

(21) Appl. No.: 15/092,969

(22) Filed: Apr. 7, 2016

(65) Prior Publication Data
US 2016/0300003 A1    Oct. 13, 2016

Related U.S. Application Data

(60) Provisional application No. 62/146,840, filed on Apr. 13, 2015.

(51) Int. Cl.
*G06F 17/50* (2006.01)

(52) U.S. Cl.
CPC ...... *G06F 17/5018* (2013.01); *G06F 17/5086* (2013.01)

(58) Field of Classification Search
CPC ... G06F 17/5018; G06F 17/5086; Y02T 10/82
See application file for complete search history.

(56) References Cited

U.S. PATENT DOCUMENTS 5,848,115 A * 12/1998 Little .................. G01N 23/046
378/4
2004/0254758 A1    12/2004 Chang
(Continued)

FOREIGN PATENT DOCUMENTS

CN         104282040 A     1/2015
EP           0875751 A1    11/1998

OTHER PUBLICATIONS

European Search Report; EP 16164943; dated Jul. 28, 2016.
(Continued)

*Primary Examiner* — S. Sough
*Assistant Examiner* — Kimberly L Jordan
(74) *Attorney, Agent, or Firm* — Lawrence Youst PLLC (57) ABSTRACT

A method of performing structural analysis relating to a component having CAD-based geometry, refined CAD-based geometry and CAD-based FEA data associated therewith. The method includes scanning the component to obtain scan-based point cloud geometry of the component, aligning the scan-based point cloud geometry with the CAD-based geometry of the component, generating scan-based geometry of the component by refining the scan-based point cloud geometry, comparing the scan-based geometry with the refined CAD-based geometry of the component to quantify geometric differences therebetween, generating scan-based FEA geometry of the component by meshing the scan-based geometry, performing finite element analysis on the scan-based FEA geometry to obtain scan-based FEA data and comparing the scan-based FEA data with the CAD-based FEA data of the component to quantify the effect of geometric difference therebetween.

20 Claims, 9 Drawing Sheets

(56) References Cited

U.S. PATENT DOCUMENTS

| | | | | |
|---|---|---|---|---|
| 2015/0339851 A1* | 11/2015 | Date | ..................... | G06T 17/205 |
| | | | | 345/420 |
| 2016/0086376 A1* | 3/2016 | Tang | ....................... | G06T 17/20 |
| | | | | 345/420 |
| 2016/0163031 A1* | 6/2016 | Gordon | ..................... | G06T 7/80 |
| | | | | 348/46 |

OTHER PUBLICATIONS

L. Barazzetti el al.; BIM From Laser Clouds and Finite Element Analysis: Combining Structural Analysis and Geometric Complexity; ISPRS—International Archives of the Photogrammetry, Remote Sensing and Spatial Information Sciences; vol. XL-5/W4; Feb. 19, 2015; Avila, Spain.

Mobley A. V. et. al; An Object Oriented Approach to Geometry Defeating for Finite Element Meshing; Oct. 26, 1998; 7th International Meshing Roundtable; Sandia National Laboratories.

\* cited by examiner

Fig.20B

ROTORCRAFT COMPONENT SIMULATION USING SCAN-BASED GEOMETRY

CROSS-REFERENCE TO RELATED APPLICATIONS

The present application claims the benefit of U.S. Provisional Application No. 62/146,840, filed Apr. 13, 2015, the contents of which are hereby incorporated by reference.

TECHNICAL FIELD OF THE DISCLOSURE

The present disclosure relates, in general, to rotorcraft component simulation based upon finite element analysis of three dimensional scan data and, in particular, to structural analysis of as-produced rotorcraft components using three dimensional scan-based finite element analysis.

BACKGROUND

Computer-aided design (CAD) is the use of computer systems to aid in the creation, modification, analysis and/or optimization of a design. For example, CAD has become an important tool used for design and analysis of mechanical components and mechanical systems in many industries including automotive, shipbuilding and aerospace, to name a few. CAD software is used to create CAD geometry that is a digital representation of the intended physical component. Use of the CAD geometry then allows for rapid modification of the component to support the design process.

In the rotorcraft industry, for example, the design process is commonly driven by the general requirement for a component to perform its function safely while minimizing weight and cost. To achieve optimal design solutions, sophisticated simulation tools may be used in conjunction with the CAD geometry. One such tool is finite element analysis (FEA) which is a software implementation of the well established finite element method. FEA provides a mathematical estimation of dependent variables such as deflections, stresses, temperatures and the like by subdividing the larger boundary value problem into simpler parts, known as finite elements, then solving a resulting system of equations. These finite elements are typically made up of a complex system of points and grids known as nodes and elements. Once the component has satisfied its FEA requirements, the resulting CAD geometry may be transferred to the production environment through 2D drawings or 3D solids including all details of the component in its nominal condition. For example, CAD output in the form of electronic files may be used to control machining tools or other operations during the manufacturing of the actual component.

SUMMARY

In a first aspect, the present disclosure is directed to a method of performing structural analysis relating to a component having CAD-based geometry, refined CAD-based geometry and CAD-based FEA data associated therewith. The method includes scanning the component to obtain scan-based point cloud geometry of the component; aligning the scan-based point cloud geometry with the CAD-based geometry of the component; generating scan-based geometry of the component by refining the scan-based point cloud geometry; comparing the scan-based geometry with the refined CAD-based geometry of the component to quantify geometric differences therebetween; generating scan-based FEA geometry of the component by meshing the scan-based geometry; performing finite element analysis on the scan-based FEA geometry to obtain scan-based FEA data; and comparing the scan-based FEA data with the CAD-based FEA data of the component to quantify the effect of geometric difference therebetween.

The method may also include using a scanning system selected from the group consisting of laser scanning systems and structured light scanning systems; using at least one of fully parametric geometry, fully non-parametric geometry and hybrid geometry; comparing the scan-based geometry with the scan-based point cloud geometry and determining whether any deviations therebetween are within an acceptable level to validate the refining process, wherein the acceptable level for deviations may be deviations within a noise level of the scanning process; comparing the scan-based FEA geometry with the scan-based point cloud geometry and determining whether any deviations therebetween are within an acceptable level to validate the meshing process, wherein the acceptable level for deviations may be deviations within a noise level of the scanning process; and/or selecting the component from the group consisting of a rotorcraft component, a forged component, a cast component, a test part component, a component having a weldment, a repaired component and a damaged component.

In a second aspect, the present disclosure is directed to a method of qualifying a component having a defect. The method includes scanning the component having the defect to obtain scan-based point cloud geometry of the component having the defect; generating scan-based geometry of the component having the defect by refining the scan-based point cloud geometry; generating scan-based FEA geometry of the component having the defect by meshing the scan-based geometry; performing finite element analysis on the scan-based FEA geometry of the component having the defect; determining whether the defect is critical to the operation of the component having the defect based upon the finite element analysis; and qualifying the component having the defect if the defect is not critical to the operation of the component having the defect.

In a third aspect, the present disclosure is directed to a method of performing structural analysis relating to a component having CAD-based geometry, refined CAD-based geometry and CAD-based FEA data associated therewith. The method includes scanning the component to obtain scan-based point cloud geometry of the component; aligning the scan-based point cloud geometry with the CAD-based geometry of the component; generating scan-based geometry of the component by refining the scan-based point cloud geometry; comparing the scan-based geometry with the scan-based point cloud geometry and determining whether any deviations therebetween are within an acceptable level to validate the refining process; comparing the scan-based geometry with the refined CAD-based geometry of the component to quantify geometric differences therebetween; generating scan-based FEA geometry of the component by meshing the scan-based geometry; comparing the scan-based FEA geometry with the scan-based point cloud geometry and determining whether any deviations therebetween are within an acceptable level to validate the meshing process; performing finite element analysis on the scan-based FEA geometry to obtain scan-based FEA data; and comparing the scan-based FEA data with the CAD-based FEA data of the component to quantify the effect of geometric difference therebetween.

BRIEF DESCRIPTION OF THE DRAWINGS

For a more complete understanding of the features and advantages of the present disclosure, reference is now made to the detailed description along with the accompanying figures in which corresponding numerals in the different figures refer to corresponding parts and in which.

DETAILED DESCRIPTION

While the making and using of various embodiments of the present disclosure are discussed in detail below, it should be appreciated that the present disclosure provides many applicable inventive concepts, which can be embodied in a wide variety of specific contexts. The specific embodiments discussed herein are merely illustrative and do not delimit the scope of the present disclosure. In the interest of clarity, all features of an actual implementation may not be described in this specification. It will of course be appreciated that in the development of any such actual embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

In the specification, reference may be made to the spatial relationships between various components and to the spatial orientation of various aspects of components as the devices are depicted in the attached drawings. However, as will be recognized by those skilled in the art after a complete reading of the present disclosure, the devices, members, apparatuses, and the like described herein may be positioned in any desired orientation. Thus, the use of terms such as "above," "below," "upper," "lower" or other like terms to describe a spatial relationship between various components or to describe the spatial orientation of aspects of such components should be understood to describe a relative relationship between the components or a spatial orientation of aspects of such components, respectively, as the device described herein may be oriented in any desired direction.

Computer-aided design (CAD) geometry is commonly used for design and analysis of mechanical components including rotorcraft components. This CAD-based geometry is a digital representation of the intended physical component that enables rapid modification of the component to support the design process. Finite element analysis (FEA) is a software tool that further enhances the design process by providing a mathematical estimation of dependent variables by subdividing the larger boundary value problem into simpler parts and solving a resulting system of equations. These finite elements are made up of a complex system of points and grids known as nodes and elements.

Figure 1:
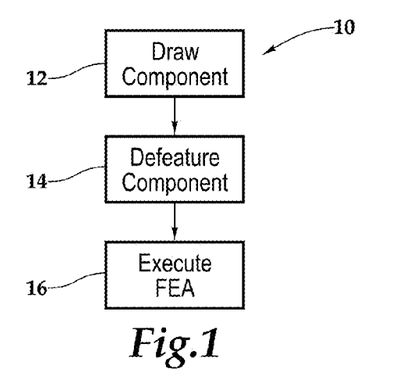
FIG. 1 is a workflow diagram for FEA of CAD-based geometric data in accordance with embodiments of the present disclosure.
Figure 2:
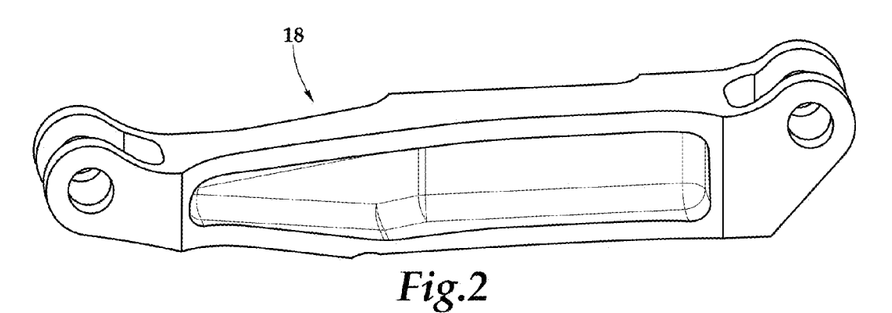
FIG. 2 is a rotorcraft component depicted in CAD-based geometry in accordance with embodiments of the present disclosure.

Referring now to FIG. 1 in the drawings, a workflow diagram for FEA of CAD-based geometric data is generally designated 10. The illustrated workflow process 10 has three phases; namely, the acquisition phase 12, the refinement phase 14 and the evaluation phase 16. The acquisition phase 12 involves using a CAD software tool to draw the desired component, such as a rotorcraft component 18 of FIG. 2. The CAD-based geometry of component 18 can later be used in a production environment and thus, typically includes all the geometric details of component 18 in its nominal condition. Alternatively or additionally, the CAD-based geometry could be based upon minimum and/or maximum material tolerance conditions or other desired criteria.

Figure 3:
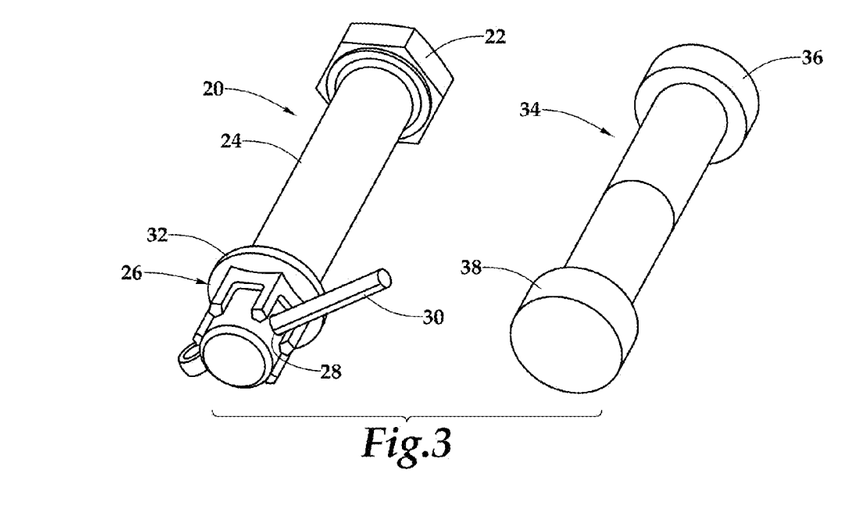
FIG. 3 is a rotorcraft component depicted in CAD-based geometry and in refined CAD-based geometry in accordance with embodiments of the present disclosure.

In FIG. 1, the geometric refinement phase 14 of workflow process 10 includes the operations needed to prepare the CAD-based geometry for later FEA analysis. For example, this includes modifying surfaces for load application, slicing, adding/modifying mating parts or fasteners and defeaturing. Since CAD-based geometry is created to guide production processes, it may be unnecessarily complex for FEA. To simplify the CAD-based geometry, defeaturing not only removes small features and details that do not influence the areas of interest to the FEA analysis, but also aids in meshing operations and overall solution time. For example, as best seen in FIG. 3, a rotorcraft component illustrated as fastener 20 has a head 22, a shaft 24 and a coupling assembly 26 used to secure fastener 20 to a mating component (not illustrated). As illustrated, coupling assembly 26 includes an opening 28 through shaft 24, a pin assembly 30 extending through opening 28 and a support assembly 32. As will be understood by those skilled in the art, the illustrated coupling assembly 26 is just one of many ways to secure fastener 20 within a mechanical system. The forces applied to shaft 24 of fastener 20 during operation, however, may not be dictated by the precise design of coupling assembly 26. Thus, for the purposes of certain aspects of FEA analysis, such as strain measurements at a midpoint section of shaft 24 during tensile loading or for applying a pre-tension load to a mating component, fastener 20 could be represented as fastener 34, which is a defeatured version of fastener 20. As illustrated, hexagonal head 22 and its interface with shaft 24 are now represented by cylindrical head 36 having parametric surfaces. Likewise, coupling assembly 26 is now represented by cylindrical head 38 having parametric surfaces.

Figure 4:
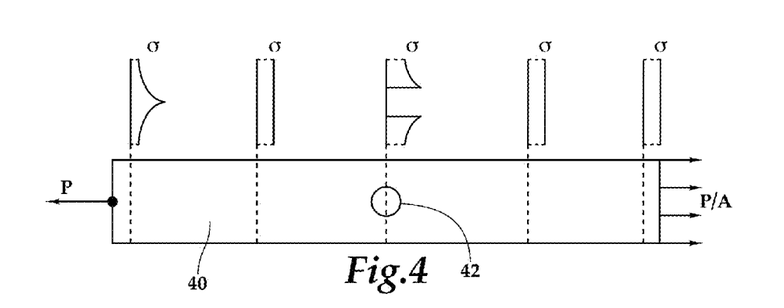
FIG. 4 is a stress diagram illustrating stress versus location along a cylindrical bar experiencing a tensile load in accordance with embodiments of the present disclosure.

The foundation for defeaturing may be found in Saint Venant's Principle which observes that two different, but statically equivalent, force systems acting on a small area of the surface of a body produce the same stress distributions at distances larger than the linear dimensions of the area where the forces act. This is illustrated in FIG. 4 where a tensile load P is applied axially to a cylindrical bar 40 of area A which has a small hole 42 in the middle of its span. As illustrated, if P is a point load on the left and the distributed pressure equal to P/A is on the right, they produce different stress distributions near the locations of load application but, as Saint Venant's Principle states, they produce the same distribution at locations sufficiently far away. Similarly, hole 42 produces a local stress concentration which influences the nearby stress distribution but farther away it has no effect. It should be noted, however, that care must be taken to avoid defeaturing geometry in a high stress location. For example, hole 42 in FIG. 4 should not be defeatured because it causes the highest stress in cylindrical bar 40. Accordingly, load application or boundary condition effects should also be considered in preparing CAD-based geometry for analysis. If an entire component, including attachment surfaces, is to be analyzed, then attention must be given to accurately model the load distribution into and out of the component. Realistic load application is difficult to simulate directly so mating parts are typically added to provide the proper underlying stiffness of the joint for more accurate load distribution.

Figure 5:
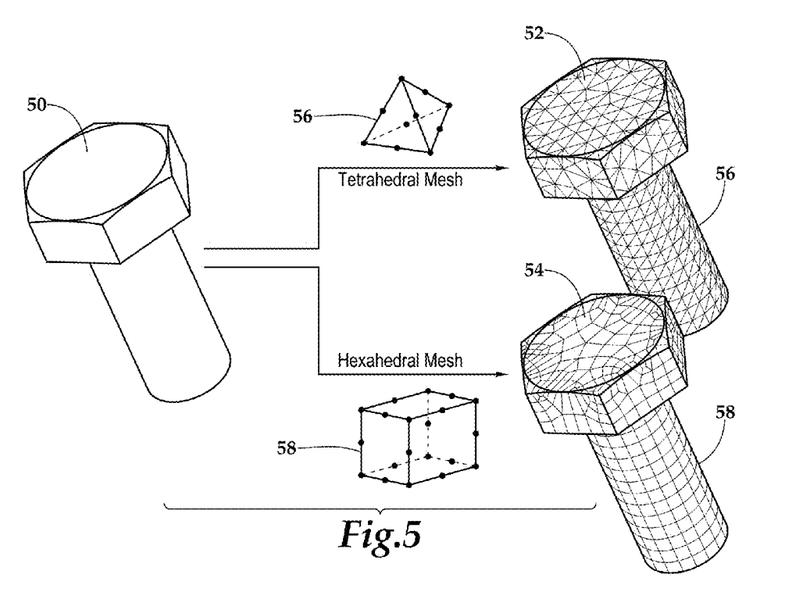
FIG. 5 is a rotorcraft component depicted in refined CAD-based geometry and two alternative forms of CAD-based FEA geometry in accordance with embodiments of the present disclosure.

As such, the CAD-based geometry is modified during the refinement phase 14 and may now be referred to as refined CAD-based geometry, which is ready for the evaluation phase 16 of the workflow process 10, as seen in FIG. 1. The evaluation phase 16 determines whether the design of a component fulfills the requirements for its function, such as supporting the expected loads, while remaining within the limits of static and fatigue stresses and strains allowed for the material. The evaluation phase 16 may include assignment of material properties, defining part interactions, meshing, application of boundary conditions/loads, solution computation and interpretation of results. Key choices must be made at each one of these steps which will influence to varying degrees the results of the analysis. The most influential step, in terms of geometry, is meshing. Meshing is the conversion of the modified CAD-based geometry into CAD-based FEA geometry in the form of representative finite elements, as shown in FIG. 5. In this example, a rotorcraft component 50 is meshed with tetrahedron shaped elements to form a CAD-based FEA geometry component 52 and with hexahedron shaped elements to form a CAD-based FEA geometry component 54. In component 52, each tetrahedron 56 has four triangular sides with a node at each corner and between each corner node. In component 54, each hexahedron element 58 includes 12 nodes between the corners and/or 8 nodes at the corners.

Figure 6:
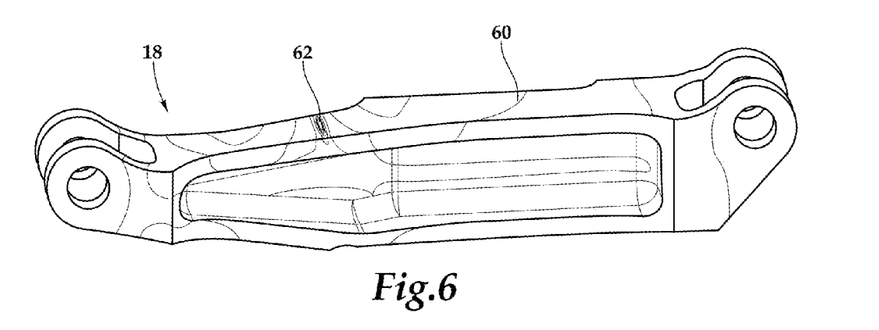
FIG. 6 is a rotorcraft component displaying thereon CAD-based FEA data in the form of a stress map in accordance with embodiments of the present disclosure.

There are a variety of types of elements to choose from with differing mathematical formulations to better represent a component depending on the shape of the geometry and the intended type of analysis to be conducted. All elements are an approximation of the CAD-based geometry and the modified CAD-based geometry, with smaller elements providing a better estimate of that geometry than larger elements. To ensure close approximation to the underlying geometry, there is a tendency to overly refine the mesh which in turn drives up the computational cost of the analysis. Typically, FEA is an iterative process where a coarse mesh is initially generated to allow for quicker debugging of the model and identification of the critical locations. Refinement of the mesh can be done in a localized region where better approximation of the geometry is required to capture a peak stress. Mesh refinement is also needed in areas of high stress gradients to obtain more accurate stresses. This is part of the result interpretation step in the FEA process. When the model solution is post-processed, results are extrapolated to corner nodes using the internal integration point results. For example, as best seen in FIG. 6, therein is depicted a rotorcraft component 18 displaying thereon CAD-based FEA data in the form of a stress map 60. At locations with stress concentrations, such as stress concentration 62 on component 18, if there are not enough elements to span the stress gradient, the computed stress will under-predict the actual stress and false conclusions can be made. Therefore, iterative mesh refinement is needed in such regions to ensure that peak stresses are captured appropriately. When this occurs, the mesh is considered converged. Further interpretation of results depends on the purpose of the model and/or the choices made during its development. An experienced analyst is able to generate valid results which will further guide the design process as subsequent CAD-based geometry modifications and FEA iterations may be needed to achieve optimal design solutions.

Figure 7:
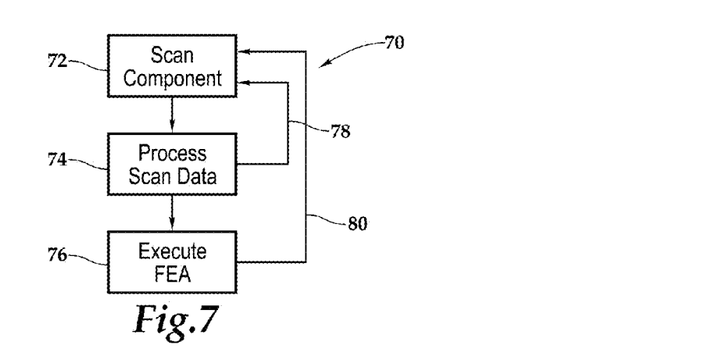
FIG. 7 is a workflow diagram for FEA of scan-based geometric data in accordance with embodiments of the present disclosure.

Referring now to FIG. 7 in the drawings, a workflow diagram for FEA of scan-based geometry is generally designated 70. Similar to the CAD-based FEA workflow 10 in FIG. 1, the scan-based workflow process 70 has three phases; namely, the acquisition phase 72, the refinement phase 74 and the evaluation phase 76. More specifically, the acquisition phase 72 consists of scanning a physical component to generate scan-based point cloud geometry, the refinement phase 74 consists of processing the scan-based point cloud geometry to generate scan-based geometry including scan-based surface geometry and/or scan-based solid geometry and the evaluation phase 76 consist of meshing the scan-based geometry to create scan-based FEA geometry which is suitable for execution of the FEA analysis. Importantly, deviation checks are included in workflow process 70 which compare the scan-based geometry with the scan-based point cloud geometry in deviation check 78 and the scan-based FEA geometry with the scan-based point cloud geometry in deviation check 80 to ensure integrity of workflow process 70 through validation of the refinement phase 74 and the geometric portions of the evaluation phase 76.

Figure 8:
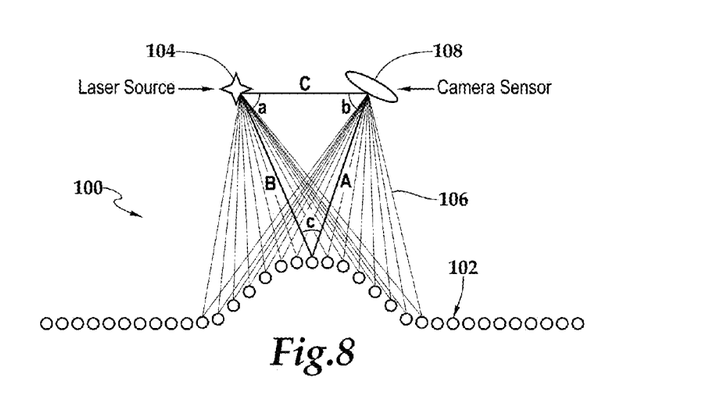
FIG. 8 is a schematic illustration of a scanning system for use in obtaining scan-based surface geometry of a component in accordance with embodiments of the present disclosure.

Referring now to FIG. 8 in the drawings, a three dimensional scanning system 100 for use during acquisition phase 72 of workflow process 70 is schematically illustrated. Three dimensional scanning system 100 utilizes a non-contact imaging system to capture the geometry of a component 102. In the illustrated embodiment, three dimensional scanning system 100 is depicted as a laser scanning system that is operable to capture external component surfaces or line-of-sight component surfaces. In the illustrated embodiment, laser scanning system 100 illuminates component 102 with a laser light source 104 and then receives the reflected light 106 with a camera sensor 108 at a fixed position relative to laser light source 104. Triangle ABC is formed by laser light source 104, camera sensor 108 and component 102. Angles 'a' and 'b' as well as distance 'C' are known. By the law of sines, the position of each point along the laser path may be computed.

Some of the desired characteristics of three dimensional scan data are quality, accuracy and resolution. Data quality is measured by the amount of inherent noise in the collected data when compared against a true surface. Data accuracy is the measure of the trueness of the captured three dimensional features of the component geometry. Resolution is a measure of the smallest detail that can be reliably captured. One of the primary goals of three dimensional scanning is to generate three dimensional coordinates in a quantity sufficient to define the physical surface and reproduce the scanned component.

Even though FIG. 8 depicts a particular type of three dimensional scanning system, it should be understood by those skilled in the art that other types of three dimensional scanning system are equally well suited for use with workflow process 70 such as structured light scanners, white/blue structured light scanners, computed tomography scanners or other suitable optical scanners. For example, structured light three dimensional scanners compute positions by projecting a light pattern of lines or a grid on the component. The camera typically employs a two dimensional sensor while the emitted light pattern consists of lines. The camera imaging sensor detects the emitted light pattern, but the pattern is distorted where it intersects the three dimensional surface. The system compares the distortion to a nominal image (with no distortion) to derive the three dimensional surface geometry. The calculated result produces a three dimensional point cloud formed from the two dimensional grid projection on the component.

The choice of a particular three dimensional scanning system is based on several considerations regarding the characteristics of the component being scanned and the desired resolution and accuracy of the data. The characteristics of the component which affect this decision include size, finish, color, stiffness and access to internal or obstructed geometric features. Operating factors influencing this choice include data acquisition rate, scanning time, portability, automation capability and the like. In general, three dimensional scanning systems can be automated for rapid data collection and are capable of achieving high resolution and accuracy. For example, current three dimensional scanning systems are able to generate a high density point cloud representation of a scanned component with millions of data points wherein geometric details less than 0.002 in (0.051 mm) can be resolved.

Figure 9:
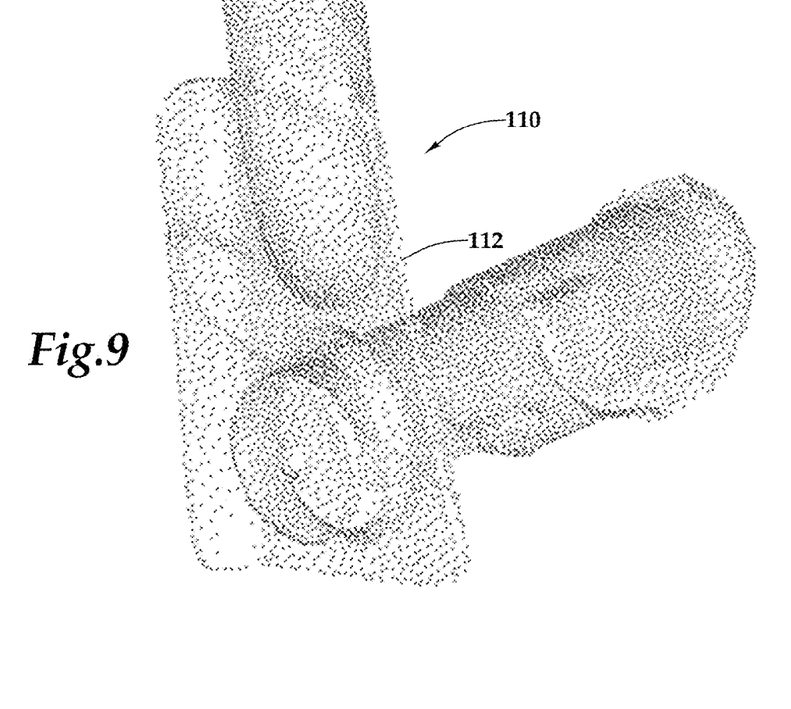
FIG. 9 is a rotorcraft component depicted as scan-based point cloud geometry in accordance with embodiments of the present disclosure.

Referring now to FIG. 9 in the drawings, a rotorcraft component 112 is depicted as scan-based point cloud geometry in the form of three dimensional point cloud 110. Point cloud 110 is the raw data obtained in acquisition phase 72 of workflow process 70. Point cloud 110 may include millions of data points representing the geometry of component 112. The scan-based point cloud geometry is then used in the refinement phase 74 as the basis for creating scan-based geometry in the form of scan-based surface geometry and/or scan-based solid geometry. In addition, the scan-based point cloud geometry is used in validation steps by comparing the scan-based point cloud geometry with the scan-based geometry in the deviation check 78 and the scan-based FEA geometry in deviation check 80.

Figure 10:
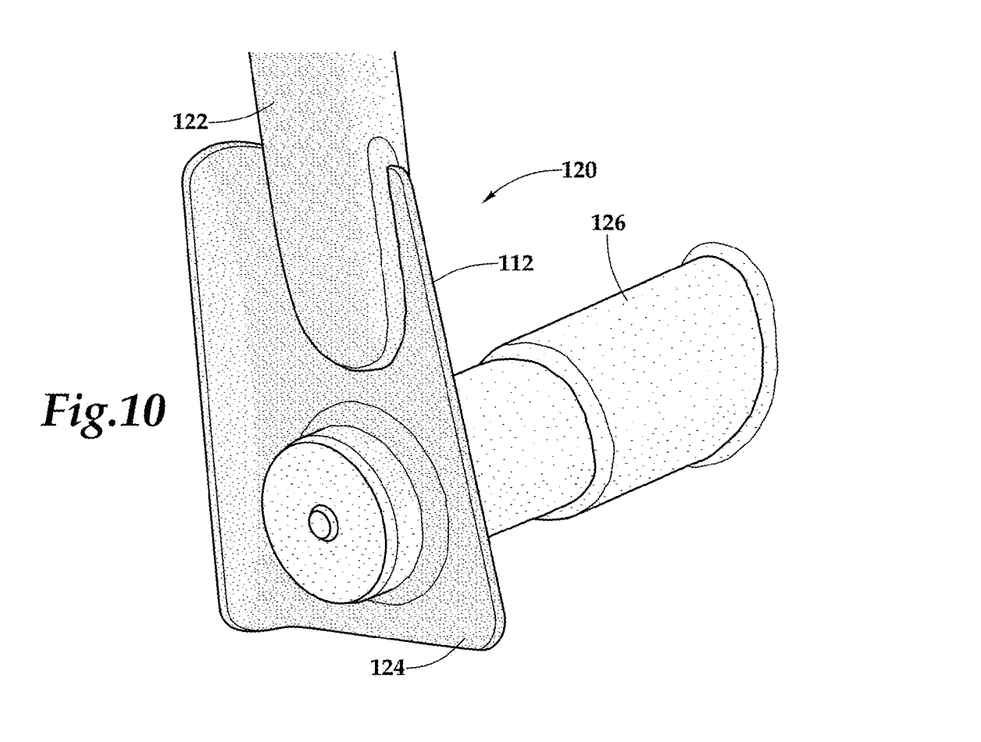
FIG. 10 is a deviation plot of scan-based point cloud geometry aligned with CAD-based geometry of a rotorcraft component in accordance with embodiments of the present disclosure.

The scan-based point cloud geometry may be filtered to remove any outliers and erroneous data, then point cloud 110 is preferably aligned with related CAD-based geometry to establish a coordinate system used during the finite element modeling. Once this is performed, all subsequent objects created will retain this coordinate system. The alignment may be accomplished, for example, by manual transformation, by a least-squares fit to a duplicate part or by feature alignment to datums or targets. As best seen in FIG. 10, a deviation plot 120 depicts a comparison between point cloud 110 and the CAD-based geometry of component 112 after a least-squares fit alignment. In the illustrated deviation plot, the density of the shading represents the level of deviation between point cloud 110 and the CAD-based geometry of component 112. This particular plot indicates there are significant differences between the nominal geometry and the geometry of the as-produced component that was scanned, for example, at locations 122, 124 where the shading has high density but little or no difference at location 126 where the shading has low density. It should be noted that if the alignment process used a different element or datum as the initial reference for matching the models, then the deviation between point cloud 110 and the CAD-based geometry of component 112 would be in different areas.

Figure 11A:
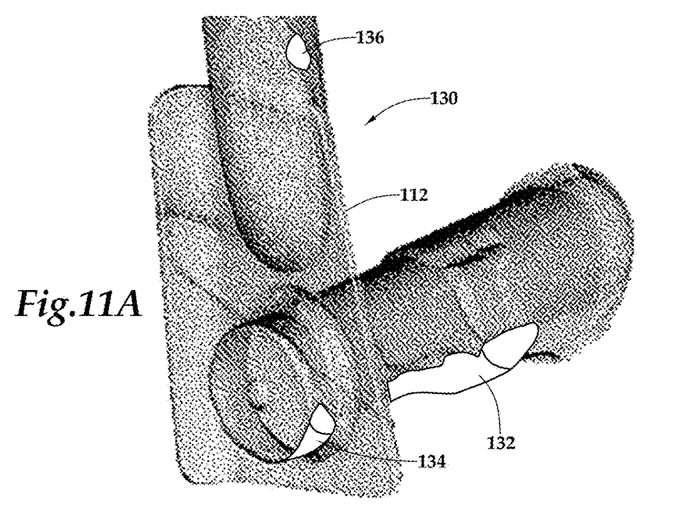
FIGS. 11A-11D depict a rotorcraft component in various stages of refinement of scan-based geometry in accordance with embodiments of the present disclosure.
Figure 11B:
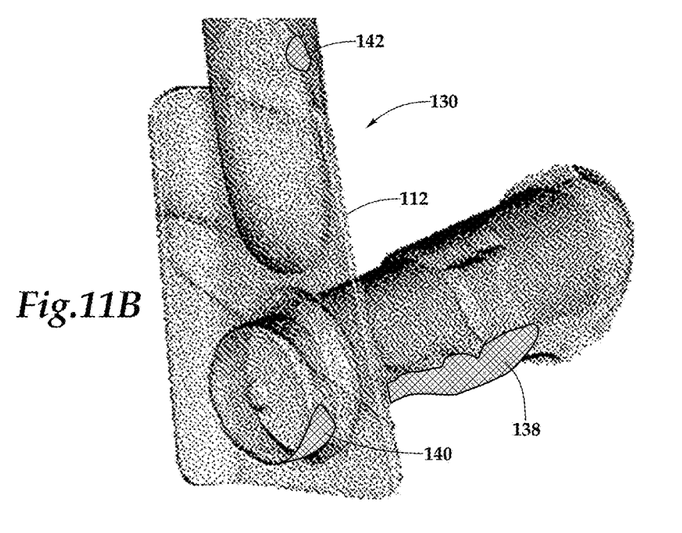

Referring next to FIGS. 11A-11D, the refinement phase 74 will now be described. In the refinement phase 74, points within point cloud 110 are connected using, for example, a polygon surface generation technique, as depicted in FIG. 11A. In the illustrated example, points of point cloud 110 are connected by a polygon surface consisting of a large plurality of triangles to form a polygon surface 130 representing a scan-based geometry of component 112. At this stage, various automated software routines may be employed to correct defects such as holes, polygon mesh twists, sharp angles, sharp corners or disconnected components, such as those depicted at location 132, 134, 136 that may cause subsequent FEA operations to fail. For example, as shown in FIG. 11B, triangle patches 138, 140, 142 have been added to correct discontinuities 132, 134, 136. Other operations to correct flaws or missing data include mirroring, offsetting, or growing/shrinking to compensate for paint or coating thicknesses. Features such as polygon cylinders may also be constructed and merged with the existing dataset. Throughout these steps, one or more deviation checks 78 may be conducted to ensure the original scan-based point cloud geometry is not altered in an unacceptable way and to validate the scan-based surface geometry.

Additional processing of the scan-based surface geometry of component 112 may be accomplished by using, for example, fully parametric geometry, fully non-parametric geometry or hybrid geometry which utilizes a combination of parametric and non-parametric features. Parametric modeling describes surfaces with features such as an extruded circle and constraints such as a parallel relationship between two surfaces. The benefits to utilizing parametric modeling tools allows for quick modification of the geometry. Design integrity and assembly conflicts are more effectively managed through parametric models. Parametric modeling requires numerous steps to build and appropriately constrain features and, as a result, can require significantly long geometry build time as compared to non-parametric and hybrid modeling.

Non-parametric modeling utilizes NURBS (Non-uniform rational basis spline) to create a mathematical surface which approximates the scan-based surface geometry. NURBS surfaces allow for complex geometry representations, however, features cannot be constrained to one another or resized as with parametric modeling. Software tools allow for creating automated non-parametric geometry which can result in extremely rapid build times.

Hybrid modeling utilizes the best attributes of both parametric and non-parametric methods. With hybrid modeling, geometry with non-parametric surfaces can be generated quickly, while parametric features are created only where needed, such as contacting surfaces and features which will be varied as part of subsequent FEA. Hybrid modeling is particularly attractive for large or complex shaped components in which fully parametric modeling is not feasible due to model build durations or where scan data may not be fully defined due to access limitations. For the latter, if enough of the feature has been captured then the missing portion may be approximated by a projection of the known data.

Figure 11C:
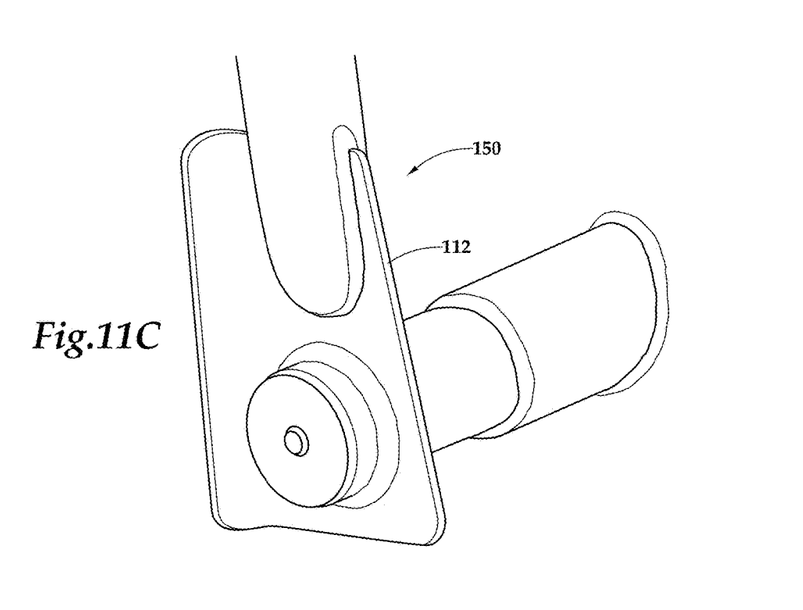

Referring next to FIG. 11C, component 112 is depicted in scan-based geometry 150 that has been further refined. For example, additional processing steps may including creating contour lines on the surface of the component to form a skeleton that guides the construction of NURBS patches. Contour lines should be placed where there are changes in curvature to improve the accuracy in those areas. Software tools allow for manipulation of contour lines so that an acceptable result can be obtained. Patches are created to divide each contour region into a smaller subset of areas to match the polygon surface. During this operation, software tools allow modification of the created patches to ensure that patch boundaries and surface detail is adequately captured. Grids are created next which divide the patch boundary into many smaller segments that define the completed model surface resolution. Finally, the NURBS surface geometry is created over the patch and grid network. Throughout these refinement steps, one or more deviation checks 78 may be conducted to ensure the original scan-based point cloud geometry is not altered in an unacceptable way and to validate the various refinements of the scan-based geometry.

Figure 11D:
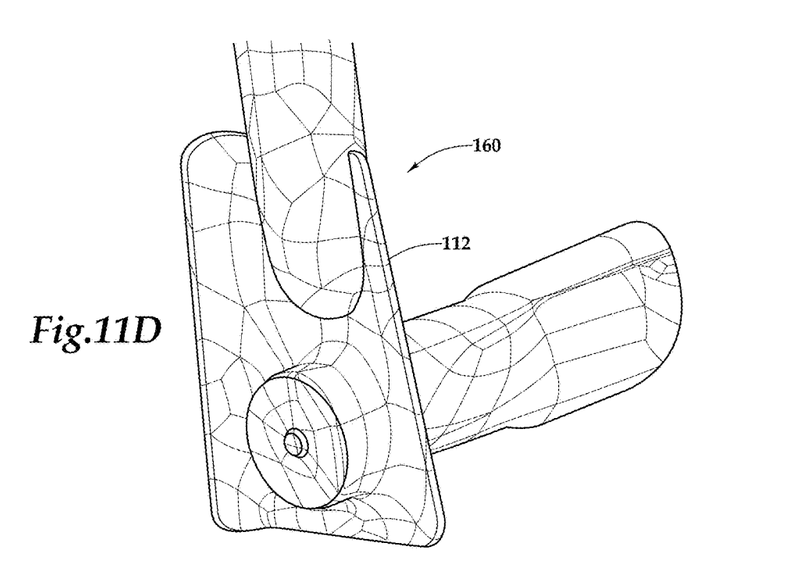

The refinement phase 74 may include processing the scan-based surface geometry to form scan-based solid geometry. As best seen in FIG. 11D, component 112 is depicted in scan-based geometry 160 as scan-based solid geometry with the detailed network of NURBS patches displayed thereon. At this point in the workflow process 70, it is preferable to verify the geometric integrity by performing another deviation comparison 78 of the scan-based geometry 160 with the original scan-based point cloud geometry.

Workflow process 70 may now proceed to the evaluation phase 76. Evaluation phase 76 in process 70 is similar to that described herein with reference to the evaluation phase 16 of the CAD-based workflow process 10. As in CAD-based FEA, the scan-based FEA includes numerous steps such as assignment of material properties, defining part interactions, meshing, application of boundary conditions/loads, solution computation and interpretation of results. There are some key differences, however, regarding meshing, part interactions, boundary conditions and load application for scan-based geometry. One of the objectives for evaluation phase 76 is to efficiently obtain accurate results. To support this goal, each step of the process should not consume more time than is needed for an appropriate level of accuracy for the model. In meshing scan-based geometry, for example, generating unneeded mesh density in non-critical locations or generating overly fine meshes on the entire component can lead to unnecessarily extended solve times as surfacing the scan data with NURBS patches can result in very small features which are difficult for the meshing algorithms to negotiate. To correct this, more time may be spent modifying patch sizing and layout as part of the scan processing activity or by using advanced mesh controls such as automatic defeaturing or pinch tolerance adjustment. These controls affect how patch dependent meshing algorithms perceive the geometry, enabling small features to be ignored where it is appropriate for the geometry to be approximated. Adjusting the pinch tolerance is a similar type of defeaturing method where a small line, for instance, is 'pinched' so that the line defined by two vertices becomes just one vertex and no line. The tolerance values must be chosen carefully so that detail is not lost in critical areas.

Patch independent meshing is another effective way to manage unnecessary complexity in the scan-based geometry. This meshing algorithm is less sensitive to small surface features and flaws because the mesh is generated first from the volume and the geometric boundary data is used to define the surface mesh. Similar defeaturing tolerances are available for patch independent meshes and the same care must be employed to avoid losing detail in critical areas. Another advanced mesh control suitable for scan-based geometry is curvature priority meshing which automatically concentrates mesh density at areas of high curvature. The curvature priority method can save some meshing time but comes with the cost of added computation time because elements are added everywhere high curvature exists. For smaller models the added computational cost is minimal but for larger models a more careful control of element count may be needed. Likewise, for the same level of accuracy, tetrahedron meshes generally have larger node/element counts but are easier to generate than hexahedron meshes so a choice must be made between savings in mesh time or solve time. To ensure an appropriate level of accuracy, deviation check 80 should be performed comparing the final scan-based FEA geometry and the original scan-based point cloud geometry to validate the scan-based FEA geometry.

It should be noted that certain FEA results on scanned non-parametric surfaces involving contacts with other parts, boundary conditions or loads may be ignored. Interpreting results in these locations is difficult even using CAD-based geometry where surfaces are in their nominal condition but can be more problematic with irregular scan surfaces which cause gaps, penetrations, and non-uniform load distributions. As discussed previously, so long as the proper load gets transferred into the part at the correct location, results are valid a certain distance away from the load application. For defining part interactions, the simplest condition is a joint which can be modeled as a bonded contact. For example, for welded parts any gaps/penetrations may be ignored. If a frictional contact is necessary, then modification of the contacting surface may be needed to create a surface which is flat, cylindrical, or the like. This would typically happen during the refinement phase 74 of the workflow process 70 as the geometry is being prepared for analysis and would entail either adding or removing material to create the desired surface. For boundary conditions and load applications similar surface modifications may be helpful because scanned surfaces will not have clearly defined and symmetric regions to apply the needed constraints and thus the load distributions may not be correct.

Figure 12:
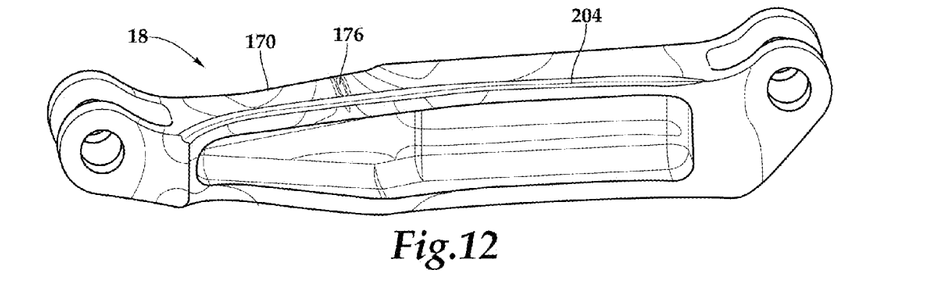
FIG. 12 is a rotorcraft component displaying thereon scan-based FEA data in the form of a stress map in accordance with embodiments of the present disclosure.

Referring now to FIG. 12 in the drawings, a rotorcraft component 18 displaying thereon scan-based FEA data in the form of a stress map 170 is depicted. In the illustrated example, rotorcraft component 18 has a manufacturing defect 204 in the form of missing material that occurred as a result of a forging process. Rotorcraft component 18 was subjected to workflow process 70 including the acquisition phase 72 wherein an as-produced rotorcraft component with a defect was scanned to obtain scan-based point cloud geometry, the refinement phase 74 wherein the scan-based point cloud geometry was processed to obtain scan-based geometry and the evaluation phase 76 wherein the scan-based geometry was analyzed to obtain scan-based FEA geometry and stress related FEA data. In the illustrated example, component 18 includes a stress concentration 176. Even though a rotorcraft component having a particular defect has been depicted and described, it should be understood by those skilled in the art that any type of component, with or without a defect, whether new or used, could alternatively be subject to workflow process 70 including, but not limited to, OEM components, aftermarket components, cast components, machined components, test part components, components having weldments, components having irregular geometries, components having batch defects, repaired components, damaged components or other mechanical components.

Figure 13:
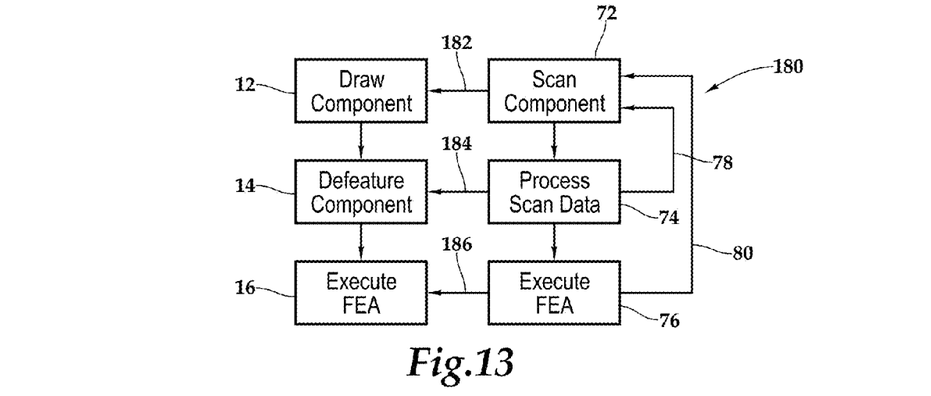
FIG. 13 is a workflow diagram for FEA of CAD-based geometric data and scan-based geometric data in accordance with embodiments of the present disclosure.

It can be beneficial to use FEA of scan-based geometry in conjunction with FEA of CAD-based geometry. For example, FIG. 13 illustrates how CAD-based and scan-based FEA may be combined into a single interrelated workflow process 180. As described above, CAD-based workflow process 10 includes the acquisition phase 12, the refinement phase 14 and the evaluation phase 16. Likewise, the scan-based workflow process 70 includes the acquisition phase 72, the refinement phase 74 and the evaluation phase 76. In addition, the scan-based workflow process 70 includes deviation checks 78 which compare the scan-based point cloud geometry with the scan-based geometry and deviation check 80 which compares the scan-based point cloud geometry with scan-based FEA geometry to ensure integrity of the scan-based workflow process. One of the strengths of the combined workflow process 180 is the addition of further steps that establish a relationship between the CAD-based and scan-based geometries; namely, the alignment phase 182, the deviation phase 184 and result comparison phase 186.

While it may seem that the combined workflow process 180 doubles the amount of time it takes to complete the analysis, this should not be the case because many of the details of the models are identical and may be duplicated from one model to the other. FEA can be a time consuming and costly endeavor without adding the complexity of scan data, so every effort should be made to reuse or modify existing CAD-based FEA when possible. One of the biggest benefits to using an existing CAD-based model is the fact that much of the hard work has been done if the model has been set up, debugged, and validated. With careful planning, it is possible to minimize the disturbance to what has been done before and save significant analysis time.

Figure 14A:
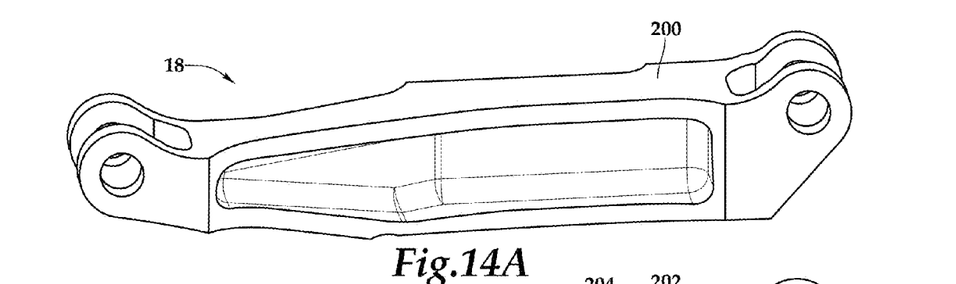
FIGS. 14A-14B depict a rotorcraft component in CAD-based geometry compared to an as-produced component in accordance with embodiments of the present disclosure.
Figure 14B:
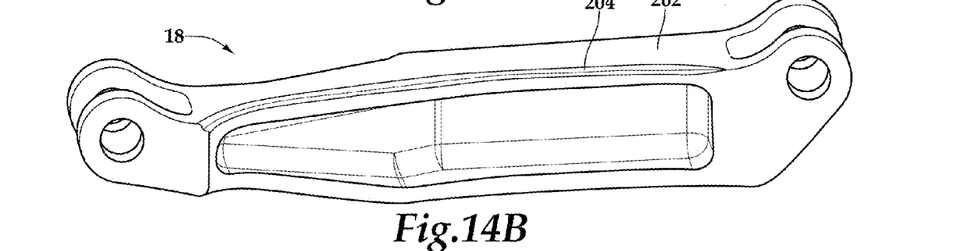

The combined workflow 180 will now be described with reference to an example rotorcraft component scenario. In FIGS. 14A-14B of the drawings, the CAD-based geometry 200 of component 18 and an as-produced unit 202 of component 18 are depicted, respectively. CAD-based geometry 200 represents the nominal condition of component 18 as designed. As-produced unit 202 is an actual component 18 manufactured using a forging process that includes a defect 204 in the form of missing material along an upper corner surface of component 18. It should be noted that one or more lots of dozens or hundreds of as-produced units 202 with defect 204 could have been manufactured due to a deviation in the manufacturing process or processes. While as-produced unit 202 does not conform exactly to the design criteria exemplified by CAD-based geometry 200, that does not mean as-produced unit 202 with defect 204 is unsuitable for its intended use. For example, defect 204 may have little or no effect on the stress concentrations experienced by component 18 during operation such as when defect 204 is sufficiently remote from such stress concentrations in accordance with Saint Venant's Principle.

In the present example, CAD-based geometry, refined CAD-based geometry, CAD-based FEA geometry and CAD-based FEA data were previously developed during the design process associated with component 18. The CAD-based geometry was used in the production process, however, as-produced unit 202 nonetheless has defect 204. Instead of attempting to alter the CAD-based geometry to match the as-produced unit 202 including defect 204 by adding and subtracting material therefrom, according to the present disclosure, the actual surface geometry of as-produced unit 202 is reproduced using a scanning system, such as three dimensional scanning system 100, as discussed herein. The scanning process yields scan-based point cloud geometry of as-produced unit 202 with defect 204, as discussed herein.

Figure 15:
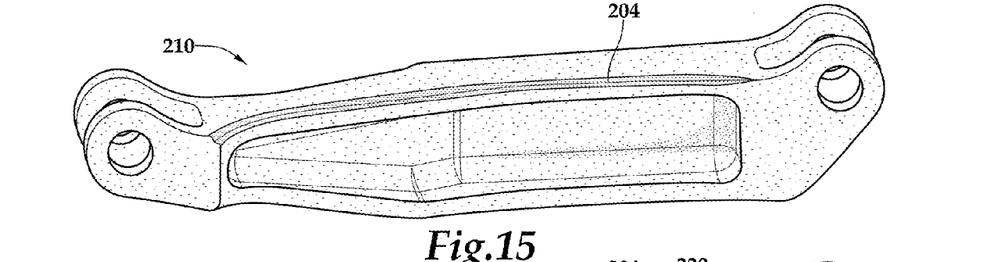
FIG. 15 is a deviation plot of scan-based point cloud geometry aligned with CAD-based geometry of a rotorcraft component in accordance with embodiments of the present disclosure.

The next step in combined workflow process 180, is the alignment phase 182 in which the scan-based point cloud geometry of as-produced unit 202 with defect 204 is align with CAD-based geometry 200 of component 18. As discussed herein, alignment can be achieved by various methods. As best seen in FIG. 15, the alignment phase 182 includes an important deviation check wherein the scan-based point cloud geometry is viewed together with the CAD-based geometry in a deviation plot 210. As illustrated, this particular plot indicates there is a significant difference between the nominal geometry and the geometry of the as-produced component along the defect 204 as indicated by high density shading but little or no difference throughout the reminder of component 18 as indicated by low density shading. The alignment phase 182 not only establishes a coordinate system upon which to base the FEA analysis, it also establishes a relationship whereby the difference between the CAD-based and scan-based geometries may be quantified. In one implementation, following alignment phase 182, the scan-based point cloud geometry of as-produced unit 202 with defect 204 may then be imported directly into the duplicate CAD-based model and prepared for analysis in place of the CAD-based geometry. This aligned position also allows for easy modification of the surfaces for part interactions, boundary conditions, and load application by using the corresponding CAD surfaces as guides.

Figure 16A:
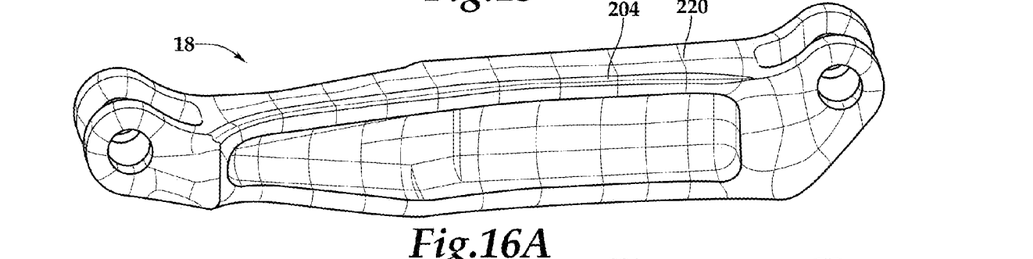
FIGS. 16A-16B depict a rotorcraft component in scan-based geometry and as a deviation plot comparing scan-based point cloud geometry with the scan-based geometry in accordance with embodiments of the present disclosure.
Figure 16B:
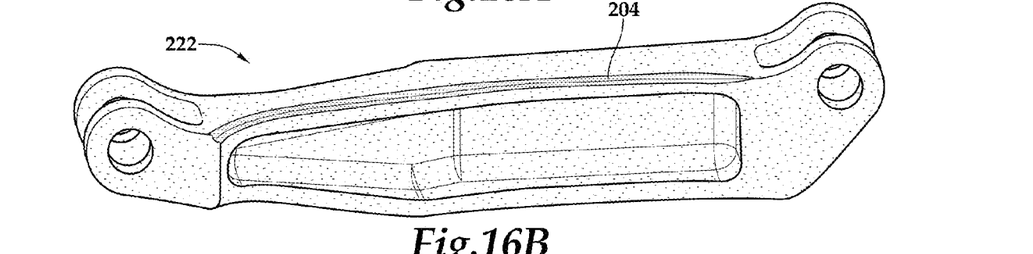

The scan-based point cloud geometry of as-produced unit 202 with defect 204 is now ready for the refinement phase 74. As discussed herein, the refinement phase 74 may include a variety of processes such as performing a polygon surface generation technique, correcting discontinuities and other flaws, incorporating parametric data, manipulating non-parametric geometry and using hybrid modeling to create the scan-based geometry of as-produced unit 202 with defect 204. In addition, as best seen in FIGS. 16A-16B, the refinement phase 74 may include one or more deviation checks 78 (see FIG. 13) wherein the scan-based geometry is compared to the scan-based point cloud geometry in a deviation plot. As illustrated in FIG. 16A, the detailed network of NURBS patches is shown on the scan-based geometry 220 of component 18. A deviation plot 222 in FIG. 16B includes high density shading along defect 204 indicating a deviation of, for example, more than 0.01 inches. In this example, the acceptable level of deviation has been determined to be less than 0.002 inches, which represents the noise level of the scanning process or the smallest geometric detail that the scanning system is capable of resolving. As the actual deviation is greater than the predetermined acceptable level of deviation, additional or alternative processing in the refinement phase 74 should be performed.

Figures 17A, 17B:
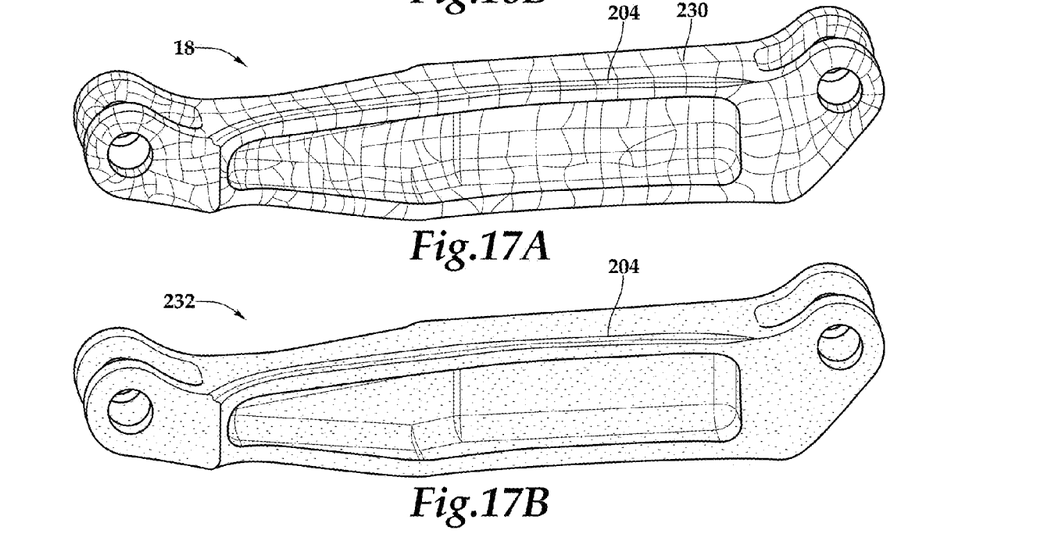
FIGS. 17A-17B depict a rotorcraft component in scan-based geometry and as a deviation plot comparing scan-based point cloud geometry with the scan-based geometry in accordance with embodiments of the present disclosure.

As best seen in FIGS. 17A-17B, additional or alternative processing in refinement phase 74 has been conducted to yield scan-based geometry 230 wherein more refined NURBS patches were used compared to scan-based geometry 220 of FIG. 16A. The deviation plot 232 in FIG. 17B, includes low density shading along defect 204, as well as on the entire component, indicating a deviation of, for example, less than 0.002 inches which is within the predetermined acceptable level of deviation.

Figure 18:
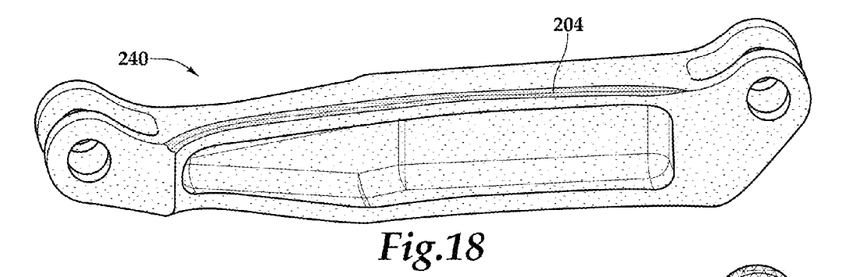
FIG. 18 is a deviation plot of scan-based geometry compared with refined CAD-based geometry in accordance with embodiments of the present disclosure.

One of the goals of the deviation phase 184 of combined workflow process 180 is to quantify the geometric differences between the CAD-based and scan-based geometries of the component. As best seen in FIG. 18, differences between the CAD-based geometry and the scan-based geometry of component 18 are being quantified in deviation plot 240. This establishes the geometric relationship between the CAD-based and scan-based geometries. Deviation plot 240 forms the basis for rationalizing the differences in FEA results observed following the evaluation phase 76. As illustrated, this particular plot indicates there is a significant difference between the CAD-based geometry and the scan-based geometry, as excepted, along the defect 204 as indicated by high density shading but little or no difference throughout the reminder of component 18, as indicated by low density shading. It should be noted that information obtained from deviation plot 240 may serve as a guide to further modification of the scan data to explore the component's geometric sensitivities.

Figure 19A:
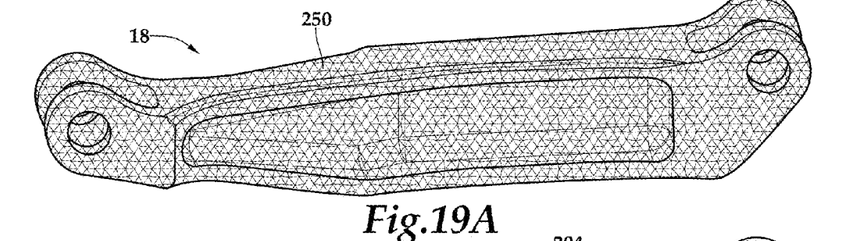
FIGS. 19A-19B depict a rotorcraft component in scan-based FEA geometry and as a deviation plot comparing scan-based point cloud geometry with the scan-based FEA geometry in accordance with embodiments of the present disclosure.
Figure 19B:
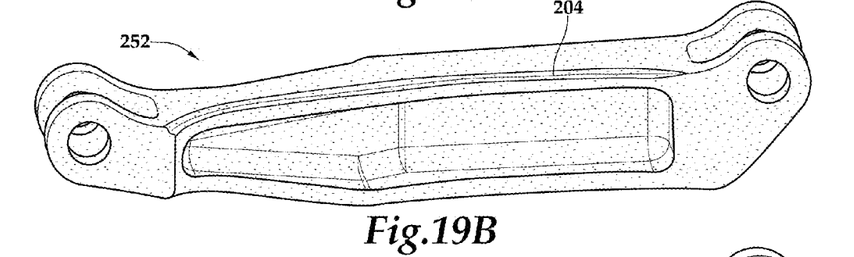

The scan-based geometry of as-produced unit 202 with defect 204 is now ready for the evaluation phase 76. As discussed above, the evaluation phase 76 may include numerous steps such as assignment of material properties, defining part interactions, meshing, application of boundary conditions/loads, solution computation and interpretation of results. As best seen in FIGS. 19A-19B, the evaluation phase 76 includes an important deviation check 80 (see FIG. 13) wherein the scan-based FEA geometry 250 is compared to the scan-based point cloud geometry in a deviation plot 252. As illustrated in FIG. 19A, the detailed mesh network is shown on the scan-based FEA geometry 250 of component 18. The deviation plot 252 in FIG. 19B includes low density shading along defect 204, as well as on the entire component, indicating a deviation of, for example, less than 0.002 inches which is within the predetermined acceptable level of deviation.

Figure 20A:
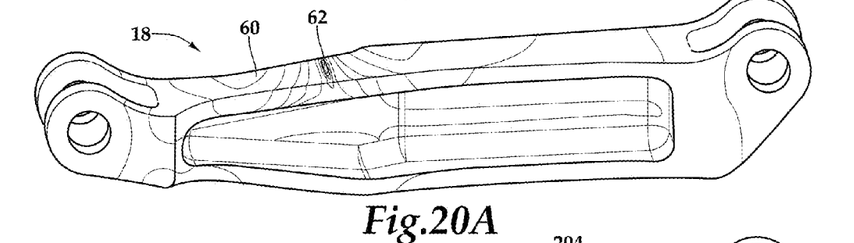
FIGS. 20A-20B depict rotorcraft components displaying thereon CAD-based FEA data and scan-based FEA data, respectively, in the form of stress maps in accordance with embodiments of the present disclosure.
Figure 20B:
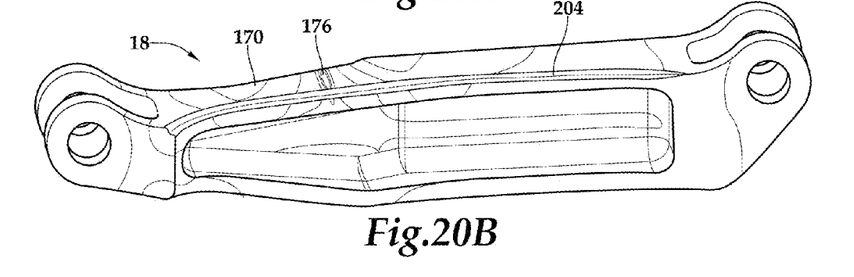

The evaluation phase 76 also includes, in this example, generation of FEA data relating to stress on component 18 during a certain operation. The FEA software generates a stress map that is visible on component 18. As illustrated, CAD-based FEA data 60 is mapped on component 18 in FIG. 20A and scan-based FEA data 170 is mapped on component 18 with defect 204 in FIG. 20B. As previously discussed with reference to FIG. 6, the CAD-based FEA data 60 reveals stress concentration 62. In the current example, the magnitude of stress at stress concentration 62 is below the acceptable design stress level thus, the CAD-based geometry for the design of component 18 was approved. Since the as-produced component 202 included the defect 204 which was outside of the design criteria, as-produced component 202 was subjected to combined workflow process 180 which resulted in the generation of scan-based FEA data 170. As previously discussed with reference to FIG. 12, the scan-based FEA data 170 reveals stress concentration 176.

In the result comparison phase 186, the CAD-based FEA data 60 and scan-based FEA data 170 should be compared to identify the effect of the geometric difference between the CAD-based and scan-based geometries. Any unexplained difference between the two may indicate a problem with the analysis which would require further investigation. In general, the result comparison phase 186 serves to validate the scan-based FEA data when similar results exist for similar geometric features. In the illustrated example, the magnitude of stress at stress concentration 176 is lower than the magnitude of stress at stress concentration 62. This difference is the key information and serves to indicate the stress in as-produced component 202 including the defect 204 is below the acceptable design stress level and thus, as-produced component 202 including the defect 204 may be qualified for use. In this case, the defect 204 in as-produced units 202 does not affect critical design performance criteria of component 18. As such, similar as-produced units with defect 204 could be qualified for use instead of scrapped. While as-produced component 202 does not conform exactly to the design criteria exemplified by the CAD-based geometry, through use of the combined workflow process 180, it has nonetheless been found to be suitable for its intended purpose and may be qualified for use.

Once scan-based geometric data and scan-based FEA data have been created for a component using, for example, workflow process 70 includes the acquisition phase 72, the refinement phase 74 and the evaluation phase 76, such data may be used as a baseline during a combined workflow process relating to a similar component. For example, the previous scan-based data could take the place of the CAD-based data in combined workflow process 180 described herein providing many of the same benefits. Use of the previous scan-based FEA with subsequent scan-based FEA may be particularly useful in scenarios involving damaged components, repaired components and components having batch defects.

While this invention has been described with reference to illustrative embodiments, this description is not intended to be construed in a limiting sense. Various modifications and combinations of the illustrative embodiments as well as other embodiments of the invention will be apparent to persons skilled in the art upon reference to the description. It is, therefore, intended that the appended claims encompass any such modifications or embodiments.

What is claimed is:

1. A method of performing structural analysis relating to a component, the method comprising:
receiving CAD-based geometry, refined CAD-based geometry and CAD-based FEA data for the component;
receiving scan-based point cloud geometry of the component;
aligning the scan-based point cloud geometry with the CAD-based geometry of the component;
generating scan-based geometry of the component by refining the scan-based point cloud geometry;
comparing the scan-based geometry with the scan-based point cloud geometry to generate a refinement deviation plot;
determining whether any deviations in the refinement deviation plot are within an acceptable level to validate the refining process;
comparing the scan-based geometry with the refined CAD-based geometry of the component to quantify geometric differences therebetween;
generating scan-based FEA geometry of the component by meshing the scan-based geometry;
comparing the scan-based FEA geometry with the scan-based point cloud geometry to generate a mesh deviation plot;
determining whether any deviations in the mesh deviation plot are within an acceptable level to validate the meshing process;
performing finite element analysis on the scan-based FEA geometry to obtain scan-based FEA data; and
comparing the scan-based FEA data with the CAD-based FEA data of the component to identify geometric difference therebetween.

2. The method as recited in claim 1 wherein receiving scan-based point cloud geometry of the component further comprises scanning the component using a scanning system selected from the group consisting of laser scanning systems and structured light scanning systems.

3. The method as recited in claim 1 wherein generating scan-based geometry of the component by refining the scan-based point cloud geometry further comprises using at least one of fully parametric geometry, fully non-parametric geometry and hybrid geometry.

4. The method as recited in claim 1 wherein the acceptable level for deviations in the refinement deviation plot further comprises deviations within a noise level of the scanning process.

5. The method as recited in claim 1 wherein the acceptable level for deviations in the mesh deviation plot further comprises deviations within a noise level of the scanning process.

6. The method as recited in claim 1 wherein the component is selected from the group consisting of a rotorcraft component, a forged component, a cast component, a test part component, a component having a weldment, a repaired component and a damaged component.

7. The method as recited in claim 1 further comprising defeaturing the CAD-based geometry to generate the refined CAD-based geometry.

8. The method as recited in claim 1 further comprising meshing the refined CAD-based geometry to generate the CAD-based FEA geometry; and
performing finite element analysis on the CAD-based FEA geometry to generate the CAD-based FEA data.

9. The method as recited in claim 1 wherein meshing the scan-based geometry further comprises converting the scan-based geometry into representative finite elements to generate the scan-based FEA geometry.

10. The method as recited in claim 1 wherein the scan-based FEA data further comprises a scan-based stress map.

11. The method as recited in claim 10 wherein the CAD-based FEA data further comprises a CAD-based stress map.

12. The method as recited in claim 11 further comprising comparing the scan-based stress map to the CAD-based stress map to identify geometric difference therebetween.

13. The method as recited in claim 1 wherein the refinement deviation plot further comprises one or more visual indicators to show deviation between the scan-based geometry and the scan-based point cloud geometry.

14. The method as recited in claim 1 wherein the mesh deviation plot further comprises one or more visual indicators to show deviation between the scan-based FEA geometry and the scan-based point cloud geometry.

15. A method of qualifying a component having a defect, the method comprising:
receiving CAD-based geometry and CAD-based FEA data for a component;
receiving scan-based point cloud geometry of the component having the defect;
aligning the scan-based point cloud geometry with the CAD-based geometry of the component;
generating scan-based geometry of the component having the defect by refining the scan-based point cloud geometry;
comparing the scan-based geometry with the scan-based point cloud geometry to generate a refinement deviation plot;
determining whether any deviations in the refinement deviation plot are within an acceptable level to validate the refining process;
generating scan-based FEA geometry of the component having the defect by meshing the scan-based geometry;
comparing the scan-based FEA geometry with the scan-based point cloud geometry to generate a mesh deviation plot;
determining whether any deviations in the mesh deviation plot are within an acceptable level to validate the meshing process;
performing finite element analysis on the scan-based FEA geometry of the component having the defect to obtain scan-based FEA data;
comparing the scan-based FEA data with the CAD-based FEA data to determine whether the defect is critical to the operation of the component having the defect based upon the finite element analysis; and
qualifying the component having the defect if the defect is not critical to the operation of the component having the defect.

16. The method as recited in claim 15 wherein generating scan-based geometry of the component having the defect by refining the scan-based point cloud geometry further comprises using at least one of fully parametric geometry, fully non-parametric geometry and hybrid geometry.

17. The method as recited in claim 15 wherein the acceptable level for deviations in the refinement deviation plot further comprises deviations within a noise level of the scanning process.

18. The method as recited in claim 15 wherein the acceptable level for deviations in the mesh deviation plot further comprises deviations within a noise level of the scanning process.

19. The method as recited in claim 15 wherein the defect is a deviation from the design of the component.

20. The method as recited in claim 15 wherein the scan-based FEA data further comprises a scan-based stress map and the CAD-based FEA data further comprises a CAD-based stress map, further comprising:
   comparing the scan-based stress map to the CAD-based stress map to determine whether the defect is critical to the operation of the component having the defect.

\* \* \* \* \*